United States Patent [19]

Rees

[11] Patent Number: 5,917,335
[45] Date of Patent: Jun. 29, 1999

[54] OUTPUT VOLTAGE CONTROLLED IMPEDANCE OUTPUT BUFFER

[75] Inventor: David B. Rees, Overton Hants, United Kingdom

[73] Assignee: Cypress Semiconductor Corp., San Jose, Calif.

[21] Appl. No.: 08/837,782

[22] Filed: Apr. 22, 1997

[51] Int. Cl.[6] .................... H03K 17/16; H03K 19/003
[52] U.S. Cl. ................ 326/27; 326/83; 326/86; 326/30
[58] Field of Search ................. 326/83, 86, 30, 326/87, 112, 119, 27

[56] References Cited

U.S. PATENT DOCUMENTS

| | | | |
|---|---|---|---|
| 3,878,483 | 4/1975 | Richardson | 331/111 |
| 4,484,149 | 11/1984 | Holloway | 330/291 |
| 4,514,704 | 4/1985 | Curtis | 330/305 |
| 4,543,561 | 9/1985 | Holloway | 340/347 |
| 4,627,085 | 12/1986 | Yuen | 377/81 |
| 4,684,831 | 8/1987 | Kruest | 307/475 |
| 4,736,125 | 4/1988 | Yuen | 307/475 |
| 4,751,404 | 6/1988 | Yuen | 307/297 |
| 4,769,589 | 9/1988 | Rosenthal | 323/313 |
| 4,800,298 | 1/1989 | Yu et al. | 307/443 |
| 4,835,420 | 5/1989 | Rosky | 307/475 |
| 4,845,385 | 7/1989 | Ruth, Jr. | 307/446 |
| 4,874,970 | 10/1989 | Coy et al. | 307/475 |
| 4,875,003 | 10/1989 | Burke | 324/73 |
| 4,876,216 | 10/1989 | Tobias et al. | 437/67 |
| 4,926,065 | 5/1990 | Coy et al. | 307/475 |
| 4,954,769 | 9/1990 | Kalthoff | 323/313 |
| 4,970,414 | 11/1990 | Ruth, Jr. | 307/446 |
| 4,972,101 | 11/1990 | Partovi et al. | 307/443 |
| 5,027,013 | 6/1991 | Coy et al. | 307/475 |
| 5,036,222 | 7/1991 | Davis | 307/443 |
| 5,047,711 | 9/1991 | Smith et al. | 324/158 |
| 5,097,148 | 3/1992 | Gabara | 307/443 |
| 5,212,440 | 5/1993 | Waller | 323/313 |
| 5,245,273 | 9/1993 | Greaves et al. | 323/313 |
| 5,252,909 | 10/1993 | Aizaki | 323/313 |
| 5,272,395 | 12/1993 | Vincelette | 307/355 |
| 5,424,629 | 6/1995 | Fujiwara et al. | 323/349 |
| 5,448,182 | 9/1995 | Countryman et al. | 326/30 |
| 5,457,407 | 10/1995 | Shu et al. | 326/30 |
| 5,514,979 | 5/1996 | Collins et al. | 326/27 |
| 5,528,166 | 6/1996 | Iikbahar | 326/27 |
| 5,559,447 | 9/1996 | Rees | 326/30 |
| 5,726,589 | 3/1998 | Cahill et al. | 326/87 |

FOREIGN PATENT DOCUMENTS

| | | |
|---|---|---|
| 317271A2 | 5/1989 | European Pat. Off. . |
| 443435B1 | 10/1995 | European Pat. Off. . |

OTHER PUBLICATIONS

Gomez, D., Specifying the ASIC Tester, EE Times, n503, T5, 1988, pp. 1–5.

*Primary Examiner*—Michael Tokar
*Assistant Examiner*—Daniel D. Chang
*Attorney, Agent, or Firm*—Christopher P. Maiorana; Maiorana & Acosta, P.C.

[57] ABSTRACT

The present invention concerns an output buffer, which overcomes previous disadvantages of driving transmission line loads by providing a variable output impedance in response to the load on the output. The buffer generally comprises a pullup device for providing a high voltage at the output in response to a first input, a pulldown device configured to provide a low voltage at the output in response to a second input and a second pulldown device configured to provide additional low drive at the output. The second pulldown device provides an impedance at the output which varies with respect to the voltage present at the output.

17 Claims, 2 Drawing Sheets

OUTPUT VOLTAGE CONTROLLED IMPEDANCE OUTPUT BUFFER

FIELD OF THE INVENTION

The present invention relates to integrated circuit output buffers generally and, more particularly, to a variable impedance output buffer.

BACKGROUND OF THE INVENTION

The communication of digital signals over wires and cables gives rise to a number of problems. Some of these problems arise when communicating information between circuits on different printed circuit boards over a backplane, or even over the short distances traversed between circuits on a single circuit board. Transmission line effects are one such problem. In fact, in the context of the fastest ECL chips with rise times of less than one nanosecond, these effects are so severe that signal lines of more than one inch must be treated as transmission lines and be properly terminated to avoid impedance mismatch and signal reflection.

At the output pin of an integrated circuit, an output buffer is typically needed to transfer signals to the signal lines. The term "buffer" may also refer to an entire IC dedicated solely to driving the signal lines. An output buffer 100 coupled to a transmission line 102 is illustrated in FIG. 1. The transmission line has a characteristic impedance $Z_0$. The output buffer 100 includes an ideal buffer 104. The "real world" output buffer 100 exhibits an output impedance $R_{LH}$ 106 when the output undergoes a low-to-high transition, and an output impedance $R_{HL}$ 108 when undergoing a high-to-low transition. These impedances are, for the most part, contributed by pull-up and pull-down transistors at the output stage of the buffer.

FIG. 2 illustrates the output of the buffer 100 (assumed to be noninverting) as it undergoes a transition from a high state (typically on the order of 3 volts) to a low state (typically 0 volts). It can be seen that a high-to-low input does not necessarily produce a sharp transition at the output. Rather, the output waveform exhibits an intermediate step before falling to the low state. This step is caused by the fact that for a high-to-low transition, the resistor $R_{HL}$ is in series with the characteristic impedance $Z_0$ and acts as a voltage divider. The height of the step depends on the relative values of $R_{HL}$ and $Z_0$ and the length of the step depends upon the roundtrip electrical delay of the output signal through the transmission line.

The input buffer of another circuit that receives the output waveform may malfunction in response to the step. Further, it is known that the step input into one end of a transmission line may cause an apparent signal skew between the two ends.

The transition step is not the only transmission line effect on the buffer output. As is well-known in the art, if the output impedance of the buffer is not closely matched to the characteristic impedance of the transmission line, then the output waveform will experience undershoot and overshoot, i.e., ringing, when it approaches its final value. On the other hand, if the output impedance is matched to the transmission line impedance during much of the step, then the buffer may not be able to sink or source a sufficient DC current if the transmission line is of low impedance or has some form of DC termination.

One can thus appreciate the desirability of eliminating both the transition step and impedance mismatch effects caused by the interface of an output buffer with a transmission line.

Other examples of output buffers may be found in, for example, U.S. Pat. No. 5,528,166, which provides a pulse controlled impedance compensated output buffer utilizing two drivers which are activated during a portion of the switching time of the output. The two drivers are activated for different durations which partially encompass the output transition. U.S. Pat. No. 5,457,407 provides a reference circuit having a plurality of reference transistors connected in parallel to each other and an output driver circuit having a corresponding plurality of driver transistors connected in parallel with each other. The transistors in the reference circuit are selectively connected in order to match an impedance of the reference transistors to the impedance of a user selected resistor, representing a fraction of the impedance of the transmission line. The selection of the reference transistors also determines the selection of the driver transistors and, as a result, causes the impedance of the output driver to match the impedance of the transmission line. U.S. Pat. No. 5,448,182 provides a driver circuit having a high impedance driver and a low impedance driver connected to the near end of a transmission line. A sensing circuit determines when a predetermined voltage is reached and provides a control signal to deactivate the low impedance driver. As a result, a limited self-adjusting impedance matching is provided. U.S. Pat. No. 5,559,477 provides an output buffer with a variable output impedance so that the output impedance is set relatively low during the initial portion of an output transition.

SUMMARY OF THE INVENTION

The present invention concerns an output buffer, which overcomes previous disadvantages by providing a variable output impedance as a function of the output voltage which itself may be a function of the load on the output. The buffer generally comprises a pullup device for providing a high voltage at the output in response to a first input, a first pulldown device configured to provide a low voltage at the output in response to a second input and a second pulldown device configured to help provide a low voltage at the output. The second pulldown device provides an impedance at the output which varies with respect to the voltage present at the output via the voltage source which acts as a voltage follower with respect to the output pad voltage.

The objects, features and advantages of the present invention include providing an output buffer having a variable output impedance in response to the voltage present at the output which generally results in variable current at the output.

BRIEF DESCRIPTION OF THE DRAWINGS

These and other objects, features and advantages of the present invention will be apparent from the following detailed description and the appended claims and drawings in which:

DETAILED DESCRIPTION OF THE INVENTION

Figure 1:
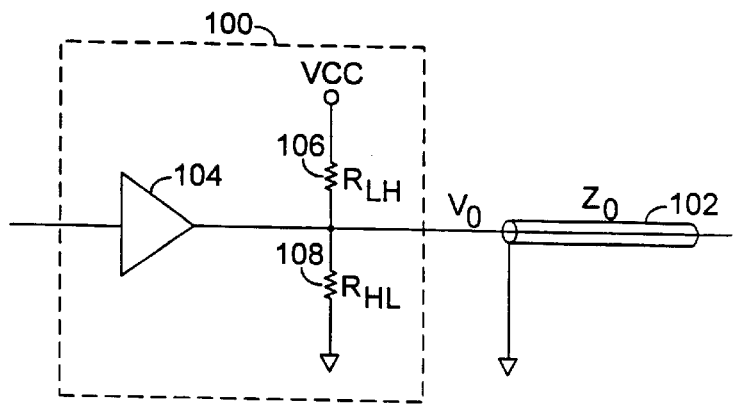
FIG. 1 illustrates a conventional output buffer coupled to a transmission line.
Figure 2:
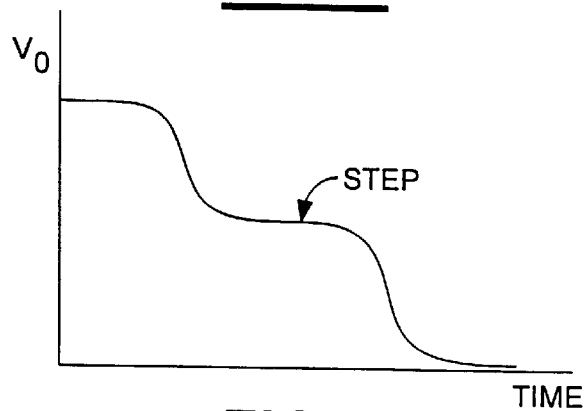
FIG. 2 illustrates the output voltage of an output buffer as it undergoes an output transition from a high state to a low state while driving a transmission line load.
Figure 3:
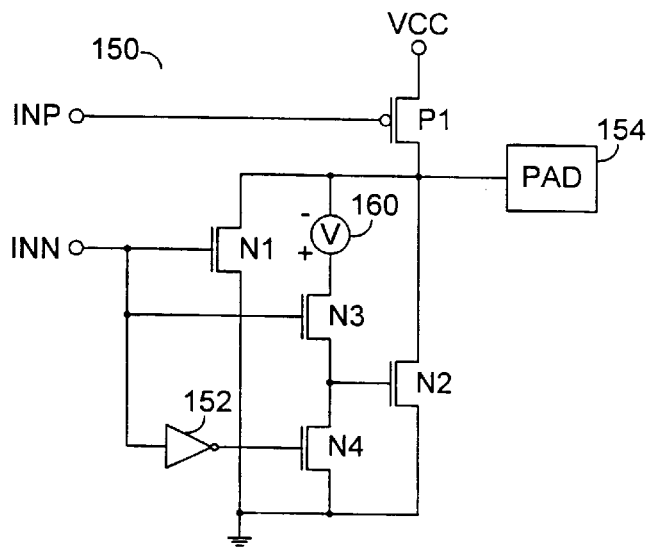
FIG. 3 is a circuit diagram of a generalized example of the present invention.

Referring to FIG. 3, an output buffer circuit 150 is shown in accordance with a generalized example of the present invention. The circuit 150 generally comprises a transistor P1, a transistor N1, a transistor N2, a transistor N3, a transistor N4, an inverter 152, a pad 154 and a voltage source 160. A gate of the transistor P1 generally receives an input signal INP. The source of the transistor P1 is generally coupled to a supply voltage VCC. The drain of the transistor P1 is generally coupled to the pad 154 as well as to drains of the transistors N1, N3 and N2. The sources of the transistors N1, N2 and N4 are generally coupled to ground GND. The source of the transistor N3 is generally coupled to both the drain of the transistor N4 as well as to the gate of the transistor N2. The gate of the transistor N3 is generally coupled to the gate of the transistor N4 and is connected through the inverter 152. The gate of the transistor N1 is generally coupled to an input signal INN. The voltage source 160 may be considered to be at 0V for purposes of explanation. However, the value of the voltage source will control the relationship between the output voltage and the impedance of N2 which is in parallel with the impedance of N1 and may be adjusted to meet the design criteria of a particular application (i.e. it is a voltage source follower).

The transistor P1 generally functions as a pullup device which can pull the pad 154 to the supply voltage VCC. The transistor P1 is generally controlled by the input signal INP and may be implemented as either a P-channel device or an N-channel device. The transistor N1 generally pulls the pad 154 to ground GND and may be controlled by the input signal INN. The size of the transistor N1 is generally determined by the DC current Iol required (in one example 24 ma) which may be realized at a maximum voltage VOL of 0.55v. The output resistance of the transistor N1 is generally not low enough to ensure that the plateau level is bound to be below one volt (the level generally required for correct circuit operation) when the $Z_0$ of the transistor line is around 20 Ω.

The pulldown transistor N2 is generally connected as a diode when the transistor N3 is turned on or can be completely turned off by turning on the transistor N4. When the output pad 154 is pulled low, the initial drive is generally provided by the transistors N1 and N2. In order to ensure that the initial plateau driving a transmission line is at 1V or below, the gate voltage on the transistor N2 needs to be around 2V when the pad may be at 1V. This may insure that the combined impedance of N1 and N2 is generally low enough with respect to the impedance of the transmission line such that the plateau is generally at or below the desired 1V load. The precise relationship between the pad voltage and the gate voltage on transistor N2 may be controlled by the voltage source follower 160 shown in FIG. 3. Such a voltage source follower on the chip may be implemented in many different ways in order to meet the design criteria of a particular application.

As the pad voltage drops below 1V (and hence the gate voltage on N2 drops below 2V), then the transistor N2 begins to shut off. Reducing the gate voltage on the transistor N2 significantly below 2V (i.e. to around 1.5V or below) will effectively turn off the transistor N2 and may dramatically increase its impedance.

The overall effect of the circuit 105 is to produce an output impedance at the pad 154 which increases quite rapidly when the pad voltage drops below 1V. Although the initial plateau level may be around 1V or below, the output impedance on the pad 154 (when the output signal is near 0V) dramatically increases to try to match the impedance $Z_0$ of the transmission line and hence reduce the noise or ringing on the output.

Figure 4:
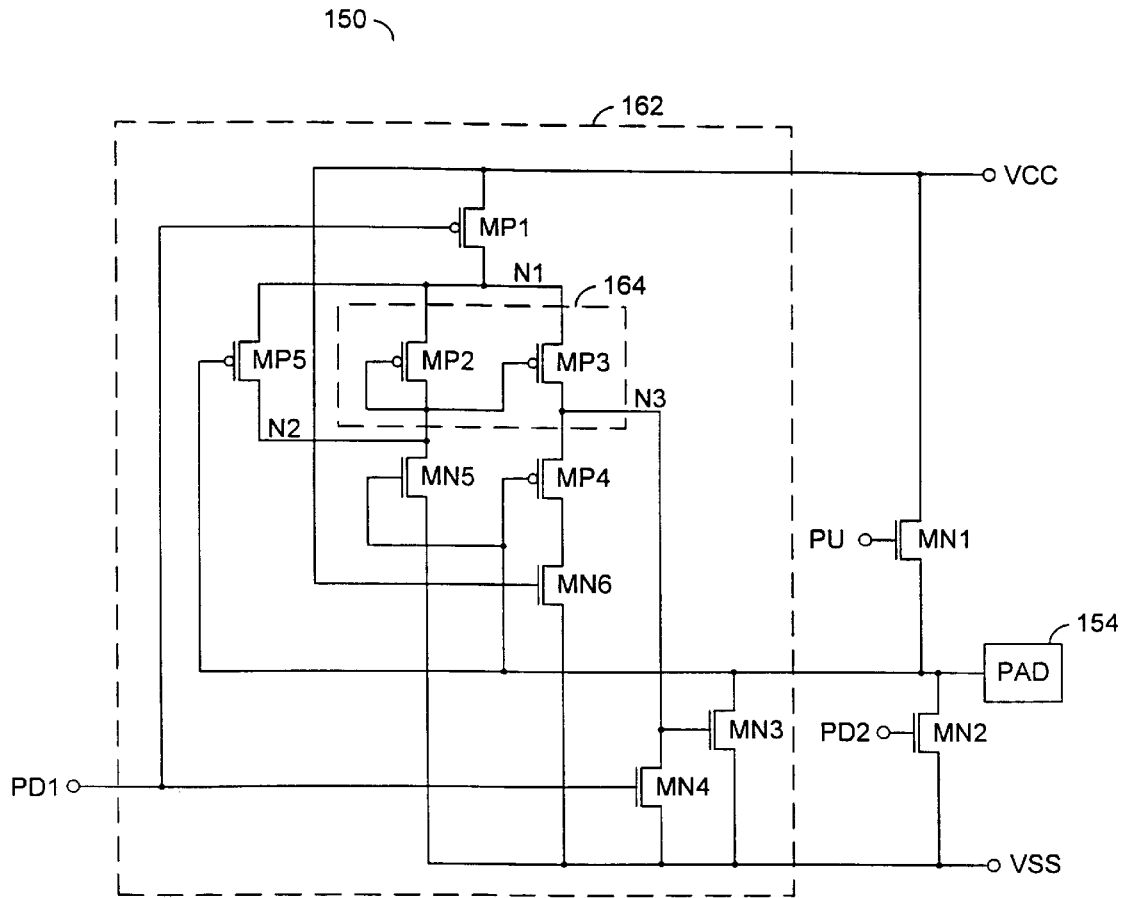
FIG. 4 is a more detailed circuit diagram of a preferred embodiment of the present invention.

Referring to FIG. 4, a more detailed diagram of the circuit 150 is shown. The circuit 150 generally comprises a transistor MP1, a transistor MP2, a transistor MP3, a transistor MP4, a transistor MP5, a transistor MN1, a transistor MN2, a transistor MN3, a transistor MN4, a transistor MN5, a transistor MN6 and a pad 154. The operation of the circuit 150 can be described generally as either pulling the output pad 154 to a high state or pulling the output pad 154 to a low state in response to an input signal PU, an input signal PD1 and an input signal PD2. The input signals PU, PD1 and PD2 are generally received from the same source, but are presented to different portions of the circuit 150. The operation of the input signal PU and PD2 provide a generally conventional function at the output pad 154. The transistors MP1, MP2, MP3, MP4, MP5, MN4, MN5, MN6 generally form a variable (or second) pulldown control circuit 162. The input signal PD1, along with the transistor MN3, and the variable pulldown control circuit 162, creates a variable output impedance at the pad 154.

The transistors MN2 and MN3 are generally pulldown devices. The transistor MN2 is generally controlled separately from the transistor MN3. The transistor MN2 may be sized to satisfy the current specifications (i.e., Iol/VOL) for the circuit 150 since the transistor MN3 will generally be turned off as voltage on the output pad 154 approaches ground (i.e., VSS or 0V), and will generally not sink any DC current.

The gate of the transistor MN4 is generally connected to the input signal PD1. The transistor MN4 generally pulls the gate of the transistor MN3 to ground (i.e., VSS) when the circuit 150 is tri-stated or is driving a logic 1, which will generally turn off the transistor MN3. Similarly, the transistor MP1 will only pull the node N1 to the supply voltage VCC if the circuit 150 is generally driving a logic 1 or is in the tri-state mode.

The transistor MN6 may be implemented as an N channel transistor having a gate tied to the supply voltage VCC. As a result, the transistor MN6 is generally on regardless of the state of the circuit 150. The transistor MN6 generally prevents the transistor MP4 from being connected directly to the ground VSS, which may cause problems in certain design applications. Under certain design criteria, the transistor MN6 may be removed.

The transistor MP2 and the transistor MP3 generally form a current mirror 164. The transistor MN5 may be implemented as an N-channel device having a gate connected to the output pad 154. When the voltage on the pad 154 approaches VSS, the transistor MN5 will generally turn off and may prevent leakage currents through the current mirror 164.

The transistor MP4 may be implemented as a P-channel transistor and may act as a voltage source follower. The transistor MP4 has a gate connected to the output pad 154 and a source connected to the gate of the pulldown transistor MN3. Under normal operation, the transistor MP4 may maintain a gate to source (VGS) P-channel threshold voltage between the source and the gate. As a result, the gate of the transistor MN3 will generally be a voltage equal to a P-channel threshold above the voltage at the output pad 154. The transistor MP4 illustrates one implementation of the voltage source follower 160 of FIG. 3. The transistor MP4 generally controls the coupling between the voltage of the output pad 154 and the gate voltage of transistor MN3.

When the output circuit 150 is driving a logic 1, the transistor MN1 is generally on, the transistor MN2 is generally off, the transistor MN4 is generally on and the transistor MN3 is generally off. The transistor MP1 will generally be off and the node N1 will generally be disconnected from the supply voltage VCC. The transistor MN5 is generally on so that the node N2 will be connected to the supply voltage VSS. The transistors MP2 and MP3 will generally be on (but there is generally no current through them since the transistor MP1 is off). Hence, the node N1 will be at a voltage between ground (VSS) and VTP above VSS since the transistors MP2 and MP3 are generally considered to be configured as diodes. Since there may be leakage currents, the transistor MP5 will generally be in a hard off state since the gate of the transistor MP5 is generally connected to the output pad 154. The transistor MP4 will also be off when the transistor MP5 is in a hard off state.

If the circuit 150 is required to change states then the transistor MN1 will turn off and the transistor MN2 will start to turn on. The transistor MN4 will turn off, disconnecting the gate of the transistor MN3 from the ground voltage VSS. The transistor MP1 will turn on, connecting the node N1 to the supply voltage VCC.

The transistor MN2 will pull the voltage at the output pad 154 toward the supply voltage VSS fairly rapidly. Additional edge rate control circuits may be implemented to reduce noise on the chip due to the output switching in order to meet the design criteria of a particular application. The fact that the transistors MN3 turns on much later than the transistor MN2 may also help to control noise (e.g., ground bounce).

Because the node N1 is pulled to the supply voltage VCC, transistor MP3 will pull node N3 (which is connected to the source of the transistor MP4 and the gate of the transistor MN3) rapidly towards the supply voltage VCC and at a rate which may be effectively controlled by the current mirror 164 formed by the transistors MP3 and MP2 where the current mirror itself may be effectively controlled by the on resistance of the transistor MN5.

The node N3 will reach a voltage which satisfies the VGS condition of the transistor MP4 which is generally configured as a source follower. Once equilibrium is reached, the transistor MP4 will maintain the node N3 at a specific voltage (VTP) above the voltage of the output pad 154 since the current mirror 164 is acting as a load for the transistor MP4. The voltage on the gate of the transistor MN3 may be maintained at a fixed voltage above the voltage at the output pad 154 which may also be connected to the drain of the transistor MN3. In one example, when the voltage at the output pad 154 is about 1V, the gate of the transistor MN3 may be at about 2V and the transistor MN3 is still on.

Since the impedance of the circuit 150 is generally a function of the transistors MN2 and MN3 (which is generally controlled by the voltage at the output pad 154), the impedance of the circuit 150 generally varies upwards as the voltage at the output pad 154 varies downwards. After a transition, the voltage at the output pad 154 will reach a level near the ground voltage VSS. The transistor MN5 will then shut off stopping the flow of current through the current mirror 164 of the transistors MP3 and MP2. The transistor MP4 will never shut off completely. Hence the transistor MP5 gradually turns on and will connect the gates of the current mirror 164 to the node N1. When this happens the leakage currents through the current mirror 164 are generally eliminated.

Since the gate of the transistor MN3 is generally at a relatively low voltage, the output impedance is primarily a function of the transistor MN2 since the transistor MN3 is virtually off and has a very high impedance. If the voltage at the output pad 154 rises significantly (perhaps due to TX line ringing), then the transistor MN3 can turn on again.

The circuits and techniques described refer to the high to low transition on the output buffer output signal and hence to the pulldown transition. The same or similar techniques could be used to control the low to high transition.

While the invention has been particularly shown and described with reference to the preferred embodiments thereof, it will be understood by those skilled in the art that various changes in form and details may be made without departing from the spirit and scope of the invention.

I claim:

1. A circuit comprising:

a pullup circuit configured to provide a first voltage at an output in response to a first input;

a first pulldown circuit configured to provide a second voltage at said output in response to a second input, wherein said first voltage is higher than said second voltage;

a second pulldown circuit configured to provide said second voltage at said output in response to said second input, whereby the impedance at said output due to said first and second pulldown circuits varies with respect to the voltage at said output; and a variable voltage source configured to control coupling between said output and said second pulldown device.

2. The circuit according to claim 1 further comprising:

a control circuit configured to control the impedance at said output due to said second pulldown device.

3. The circuit according to claim 2, wherein said control circuit further comprises:

a second circuit configured to provide a gate voltage to said second pulldown device, wherein said gate voltage is a function of the voltage at said output.

4. The circuit according to claim 3 wherein said second control circuit comprises a voltage source follower circuit.

5. The circuit according to claim 1 wherein said second pulldown circuit further comprises:

a current mirror circuit configured to provide a variable current at said output in response to said first and second inputs.

6. The circuit according to claim 5 further comprising:

a device connected to said current mirror configured to maintain a gate to source voltage between the second pulldown device and ground.

7. The circuit according to claim 1 wherein the impedance at the output increases as the voltage at the output decreases.

8. The circuit according to claim 1 wherein said pulldown device is sized to provide a particular current at said output.

9. A circuit comprising:

means for pulling up an output to a first voltage in response to a first input;

means for pulling down said output to a second voltage in response to a second input, wherein said first voltage is higher than said second voltage;

means for variably pulling said output to said first or second voltage in response to said second input, wherein the impedance at said output varies with respect to the voltage at said output; and means for maintain a ate to source voltage between said pulldown means and ground, wherein said means for maintaining is connected to said variable pull means.

10. The circuit according to claim 9 further comprising:

means for controlling a coupling between said output and said variable pull means.

11. The circuit according to claim 9 wherein said variable pull means further comprises:

means for providing a variable current at said output in response to said first and second inputs.

12. The circuit according to claim 9 wherein the impedance at the output increases as the voltage at the output decreases.

13. The circuit according to claim 9 wherein said pull-down means is sized to provide a particular current at said output.

14. A method for controlling the voltage and impedance at an output comprising the steps of:

generating a first voltage at an output in response to a first input;

generating a second voltage different from said first voltage at said output in response to a second input, wherein the impedance at said output varies with respect to the voltage at said output; and generating a variable voltage source configured to control coupling between said output and said second voltage.

15. The method according to claim 14 wherein said impedance at the output increases as the voltage at the output decreases.

16. The method according to claim 15 further comprising the step of:

generating a particular current at said output.

17. The method according to claim 14 further comprises the steps of:

generating a third voltage different from said second voltage, wherein said third voltage varies with respect to the voltage at said output.

* * * * *